(12) United States Patent
Suzuki (10) Patent No.: US 6,288,958 B1
(45) Date of Patent: Sep. 11, 2001

(54) SEMICONDUCTOR STORAGE DEVICE AND BURN-IN TEST METHOD

(75) Inventor: Junnichi Suzuki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/580,311

(22) Filed: May 26, 2000

(30) Foreign Application Priority Data

May 31, 1999 (JP) .................................................. 11-152185

(51) Int. Cl.[7] .............................................................. G11C 7/00
(52) U.S. Cl. ........................................ 365/201; 365/230.03
(58) Field of Search ............................... 365/201, 230.03, 365/189.01

(56) References Cited

U.S. PATENT DOCUMENTS

| 5,636,163 | * | 6/1997 | Furutani et al. ...................... 365/201 |
| 5,875,137 | * | 2/1999 | Suzuki ................................. 365/201 |
| 5,954,832 | * | 9/1999 | Leblanc ................................ 365/201 |
| 6,018,485 | * | 1/2000 | Cha et al. ............................. 365/201 |

* cited by examiner

Primary Examiner—Son T. Dinh
(74) Attorney, Agent, or Firm—Darryl G. Walker (57) ABSTRACT

A semiconductor storage device may shorten burn-in test times without adversely affecting a normal mode of operation. According to one embodiment, a determination circuit 60 can select multiple memory section (10 and 20) simultaneously in a burn-in test, and prevent such a simultaneous selection of multiple memory sections (10 and 20) in a normal mode of operation.

20 Claims, 4 Drawing Sheets

FIG. 1

| EXTERNAL PIN | SIGNAL FROM SELECTION CIRCUIT 41 | SIGNAL FROM SELECTION CIRCUIT 42 | CE20 | CE10 |
|---|---|---|---|---|
| H | H | H | H | H |
| H | H | L | H | H |
| H | L | H | H | H |
| H | L | L | H | H |
| L | H | H | L | L |
| L | H | L | H | L |
| L | L | H | L | H |
| L | L | L | L | L |

SEMICONDUCTOR STORAGE DEVICE AND BURN-IN TEST METHOD

TECHNICAL FIELD

The present invention relates generally to semiconductor storage devices, and more particularly to semiconductor storage devices that include a plurality of different memory types.

BACKGROUND OF THE INVENTION

Many semiconductor memory devices typically include memory cells of one type. Such semiconductor memory devices may include one or more arrays of one type of memory cell (e.g., dynamic random access memory (DRAM) cells). However, semiconductor memory devices may also have two or more memory sections, where each of which may contain a different memory type.

To improve quality and reliability, semiconductor memory devices may be subject to a "burn-in" test. A burn-in test can be a type of screening that operates a device at a high temperature, typically about 125° C. Such a higher temperature can accelerate latent defects, thus detecting devices that may initially operate normally, but subsequently fail over time.

Conventionally a burn-in test can follow the normal operation of a semiconductor device. Consequently, in a semiconductor memory device that includes two or more memory sections, only one memory section is tested at a time. Thus, a burn-in test for such devices can switch between memory sections, stressing only one individual memory section at a time. As a result, the more memory sections a semiconductor device includes, the longer a burn-in test may take. Longer burn-in tests can slow manufacturing throughput and/or increase testing costs.

Figure 5:
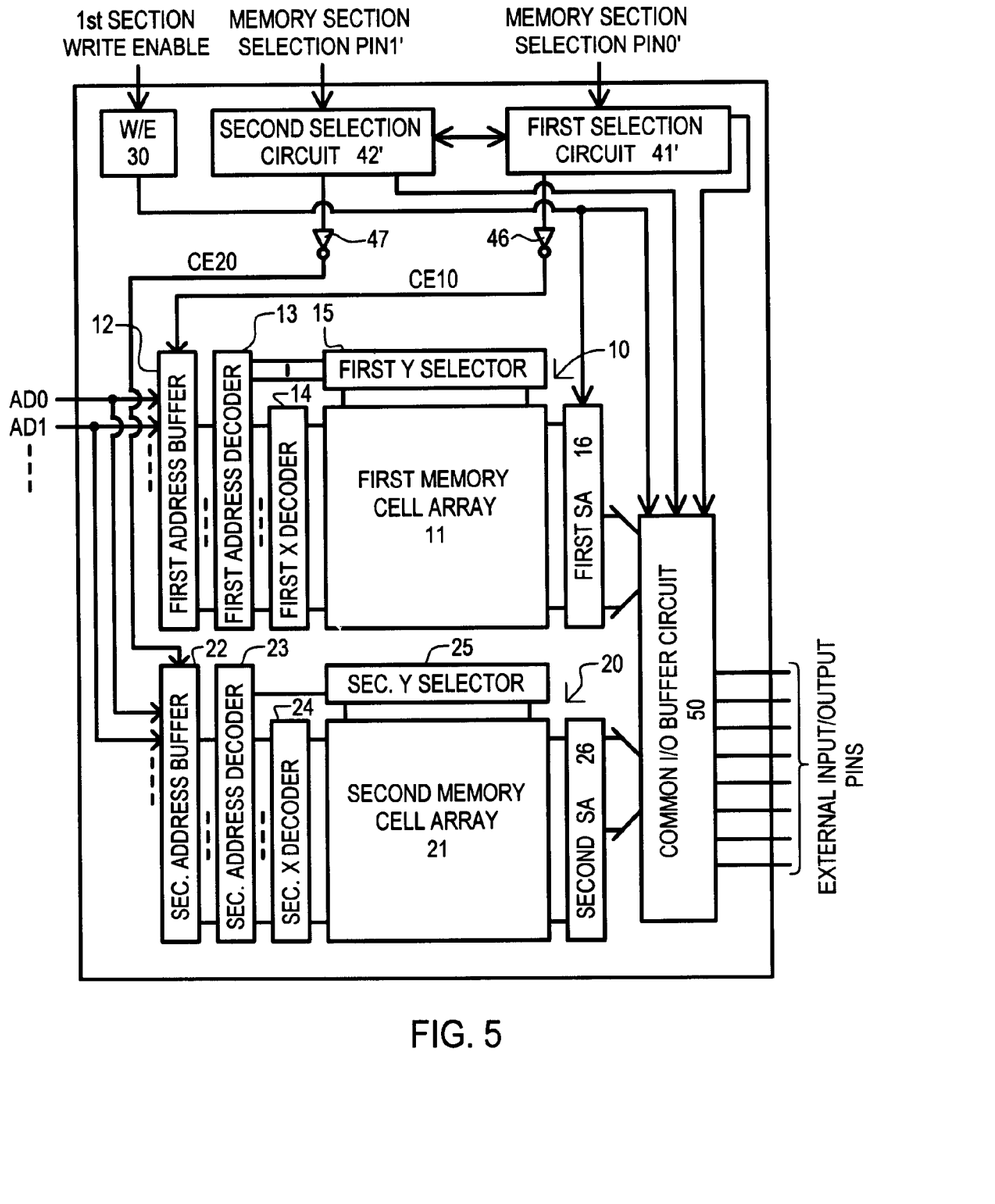
FIG. 5 is a diagram of a conventional semiconductor storage device.

To better understand the present invention, a conventional semiconductor storage device having two memory sections, and a corresponding normal and burn-in test mode will now be described. Referring now to FIG. 5, a conventional semiconductor storage device is shown that includes two memory sections, a random access memory (RAM) section 10 and a read-only-memory section 20. Herein, a RAM section 10 will be referred to as a first memory section and a ROM section 20 will be referred to as a second memory section. The first and second memory sections (10 and 20) may include respective memory cell arrays, and peripheral circuits that may receive and decode an applied address to access memory cells within each memory section (10 and 20).

FIG. 5 is shown to particularly include a first memory section (RAM) 10 that includes a first memory cell array 11, a first address buffer 12, a first address decoder 13, a first X decoder 14, a first Y selector 15, and a first sense amplifier 16. Similarly, a second memory section (ROM) 20 may include a second memory cell array 21, a second address buffer 22, a second address decoder 23, a second X decoder 24, a second Y selector 25, and a second sense amplifier 26.

An address, represented as AD0, AD1 . . . , can be supplied to first and second address buffers (12 and 22). First and second address buffers 12 and 22 can be connected to first and second address decoders 13 and 23, respectively. First address decoder 13 may be connected to first X decoder 14 and first Y selector 15. Second address decoder 23 may be connected to second X decoder 24 and second Y selector 25. The first X decoder 14 and Y selector 15 may be connected to first memory cell array 11, while second X decoder 24 and Y selector 25 may be connected to second memory cell array 21. A first memory cell array 11 may be connected to first sense amplifier 16 and second memory cell array 21 may be connected to second sense amplifier 26.

The conventional semiconductor storage device of FIG. 5 may also include a write enable (W/E) circuit 30, a first selection circuit 41' and a second selection circuit 42'. A W/E circuit 30 may place a first memory section 10 in a write mode. In FIG. 5, a W/E circuit 30 may be connected to a first sense amplifier 16 and a common input/output (I/O) buffer circuit 50.

A first selection circuit 41' may be connected to a memory section selection pin (pin0') and can activate or deactivate a first memory section 10, while a second selection circuit 42' may be connected to a second selection pin (pin1') and can activate or deactivate a second memory section 20.

In operation, a first selection circuit 41' may provide a first chip selection signal CE10 to a first address buffer 12 by way of a first inverter 46. A second selection circuit 42' may provide a second chip selection signal CE20 by way of a second inverter 47. First and second selection circuits (41' and 42') can also be connected to common I/O buffer circuit 50

A common I/O buffer circuit 50 can serve to reduce the number of external I/O pins necessary for outputting and/or inputting data to the first or second memory sections (10 and 20).

As noted above, a typical conventional burn-in test for a semiconductor storage device can be conducted while the semiconductor storage device is operating in a normal manner. Thus, for a semiconductor storage device such as that shown in FIG. 5, one of the memory sections (10 or 20) can be selected by providing a particular logic value (e.g., a low logic value) as an input to a first selection circuit 41' or a second selection circuit 42'.

By way of example, assume that a low logic value is supplied as an input to first selection circuit 41' at memory section selection pin0'. A low pin0' value can result in the first chip section selection CE10 being active (e.g., high). An active CE10 signal can select the first memory section 10.

Next, assume that a low logic value is supplied to as an input to the second selection circuit at memory selection pin1'. In this case, a low pin1' value can result in the second chip section selection CE20 being active (e.g., high). An active CE20 signal can select the second memory section 20.

If both first and second selection pins (pin0' and pin1') receive inactive levels (e.g., high), both first and second memory sections (10 and 20) can be disabled.

However, if both first and second selection pins (pin0' and pin1') receive active levels, both first and second memory sections (10 and 20) can be enabled. Such a state is not desirable in a normal mode of operation as first and second memory sections (10 and 20) can share a common I/O buffer circuit 50, and multiple data sets could arrive at the same time providing invalid results. For these reasons, conventional semiconductor storage devices that follow normal modes of operation during a burn-in test have activated only a first or second memory section (10 and 20) in such a burn-in test.

As noted above, in the normal operation of a conventional semiconductor storage device, first and second memory sections are not activated simultaneously. Thus, because a burn-in test can follow a normal operating procedure, burn-in tests can be conducted as shown in FIG. 6A.

Figure 6A:
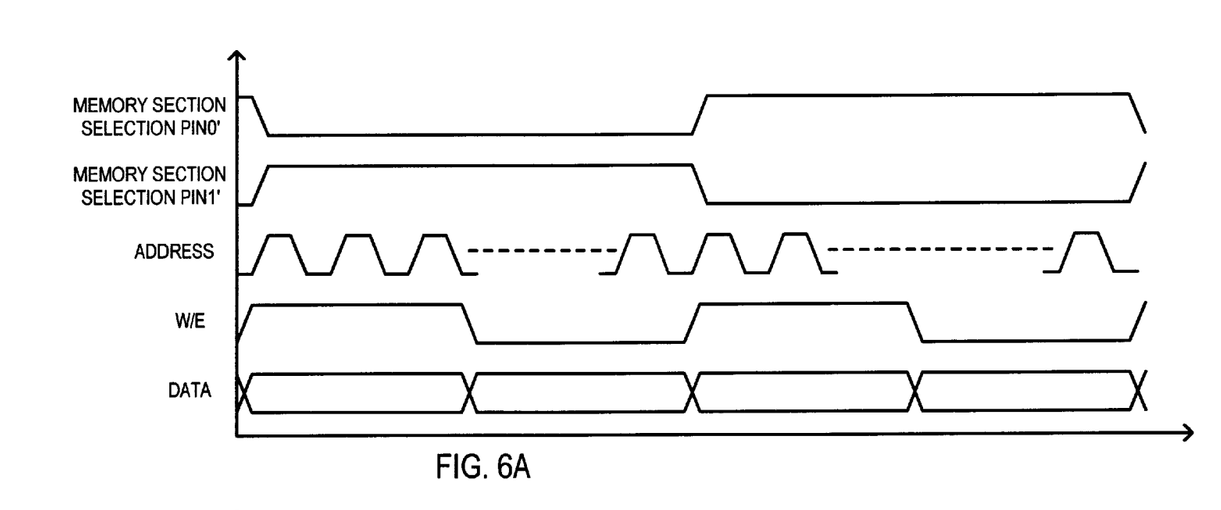
FIG. 6A is a timing diagram showing the access to memory cells in a burn-in test in a conventional semiconductor storage device.

FIG. 6A shows access to memory cells during a burn-in test in a conventional semiconductor storage device. As shown in FIG. 6A, initially a low value is applied to memory section selection pin0' and a high value is applied to memory section selection pin1' to access a first memory section 10. Subsequently, a high value is applied to memory section selection pin0' and a low value is applied to memory section selection pin1' to access a second memory section 20. Such an arrangement can increase test times, as each memory section (10 and 20) is activated one after the other.

Various other conventional approaches related to the present invention are known. Japanese Patent Laid-Open No. 6-84396 (hereinafter referred to as "prior art 1"), describes a semiconductor storage device designed to reduce a dynamic bias test time (BT). In prior art 1, a semiconductor storage device can include multiple memory sections. When a test signal is inactive, one section selection signal can be activated according to an address signal. When a test signal is active, all section selection signals can be activated, allowing all sections to operate in parallel.

Japanese Patent Laid-Open No. 4-298900 (hereinafter referred to as prior art 2) describes a semiconductor memory apparatus designed to simplify the circuit configuration of an operation stress acceleration testing (BT) apparatus. The approach is believed to increase the number of BT tests that may be conducted simultaneously, reduce the cost of a BT testing apparatus, and improve the reliability and range of applications for such an apparatus.

In prior art 2, a semiconductor memory apparatus can include a voltage detection circuit that can generate a voltage monitoring signal. The voltage monitoring signal may be active when a voltage higher than a predetermined reference voltage is applied to a particular terminal. In addition, a clock generator may generate a clock signal when the voltage monitoring signal is active. A test signal generator may then generate a test signal, each according to the clock signal. A switching circuit is provided that supplies each test signal to an internal circuit when the voltage monitoring signal is active.

Japanese Patent Laid-Open No. 6-60697 (hereinafter referred to as prior art 3) describes a semiconductor memory apparatus designed to reduce burn-in time. In prior art 3, a semiconductor memory apparatus is provided with a burn-in test mode detection circuit that may detect a burn-in mode. A switching circuit is provided that may allow the simultaneous selection of two times as many (or more) memory cells than in a normal mode of operation.

Japanese Patent Laid-Open No. 6-76599 (hereinafter referred to as prior art 4) describes a semiconductor storage device that may reduce the time required to select all word lines and thus reduce burn-in time. In prior art 4, a semiconductor storage device can include a word line selection circuit and a test selection circuit that may receive a test signal. When the test signal is inactive, the test selection circuit may be isolated from the word lines and a normal operation may take place. In a normal operation, one of a number of word lines may be selected according to an address signal. When the test signal is active, the word line selection signal may be isolated from the word lines, and a test line selection circuit can select two or more of the word lines.

Japanese Patent Laid-Open No. 7-244998 (hereinafter referred to as prior art 5) describes a semiconductor memory apparatus that can select all memory cells simultaneously during a burn-in test, and at the same time not disturb the normal operating speed of the semiconductor memory apparatus. Reduction in the time required for burn-in test can result. In prior art 5, a semiconductor memory apparatus may include potential supply circuits that provide a Vdd voltage level and a Vxx voltage level to final stages of a word line decoder. Such final stages can include inverters. A selected final stage can receive a Vdd level, while de-selected stages can receive a Vxx. In a normal mode of operation the Vxx level may be set to a voltage equal to or greater than a low supply level Vss. In a burn-in test, the voltage Vxx may be set to the Vdd. In this way, all final word line stages can receive a high voltage level in a burn-in test.

The various described prior art devices 1–5 all address a semiconductor storage device having a number of memory sections of the same type. Such approaches are different than those that include memory sections of different types, as will be described in the embodiments below.

It is also noted that prior art 1 has an uncontrolled output section. A drawback to such an arrangement is that when output data from different memory sections are supplied to the output section simultaneously, a large amount of current can be drawn.

It is further noted that prior art 2 is related to a burn-in test apparatus as opposed to a semiconductor storage device.

It would be desirable to arrive at some way of providing a semiconductor storage device that can have a faster burn-in test time, and yet not suffer from drawbacks during a normal operation, as is the case of other conventional approaches.

SUMMARY OF THE INVENTION

It is an object of the present invention to provide a semiconductor storage device that includes a number of memory sections of different types, such as a static random access memory, a dynamic random access memory, a flash EEPROM memory, and/or a mask ROM, where two or more memory sections can be activated during a burn-in test, yet normal operations are not adversely affected. Such a semiconductor storage device can provide for faster burn-in test times than conventional approaches.

The present invention may include a semiconductor storage device having memory sections of different types that can be placed in a normal mode and an alternate mode. In an alternate mode two or more memory sections can be activated simultaneously. This can allow multiple memory sections to be burn-in tested in the amount time required to burn-in test one memory section. In particular, the one memory section can be the memory section that takes the longest time to burn-in.

DETAILED DESCRIPTION OF THE EMBODIMENTS

Various embodiments of the present invention will now be described in detail with reference to a number of drawings.

Figure 1:
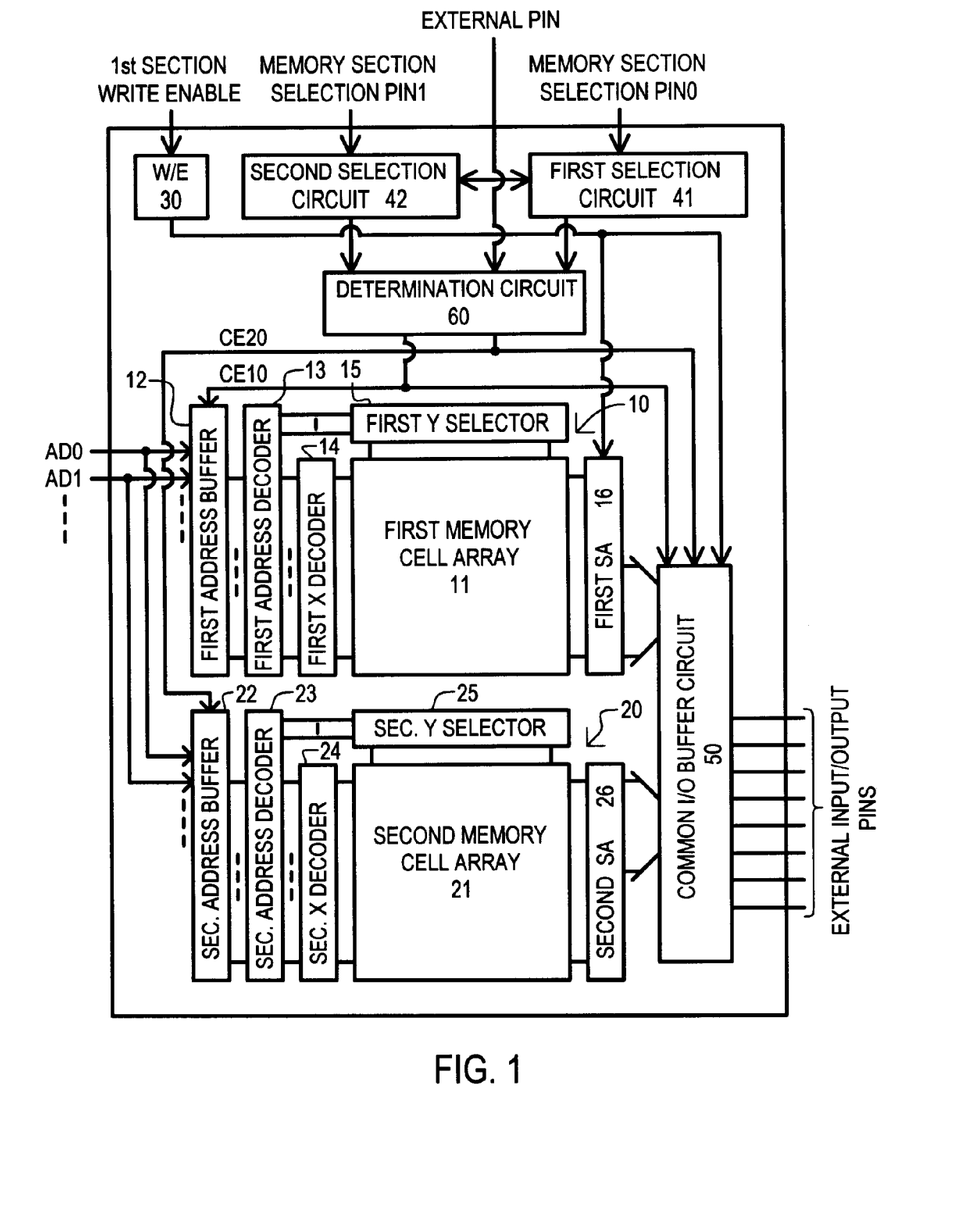
FIG. 1 is block diagram of a semiconductor storage device according to one embodiment.

Referring now to FIG. 1, a semiconductor storage device according to one embodiment is set forth in a block diagram. As shown in FIG. 1, the semiconductor storage device according to one embodiment may include some of the general components as that shown in FIG. 5. An embodiment may differ from the conventional case in that a first selection circuit 41, a second selection circuit 42, and a determination circuit 60 may be provided instead of a first and second selection circuit 41' and 42'. Accordingly, like components will be referred to by the same reference characters. Further, the explanation of such like components will be omitted to avoid undue repetition.

A first selection circuit 41 may activate a first memory section 10 (which can be a memory of one type, such as a random access memory (RAM)) according to the potential of first memory selection pin (pin0). A second selection circuit 42 may activate a second memory section 20 (which can be a memory of another type, such as a read-only-memory (ROM)) according to the potential of first memory selection pin (pin1).

A determination circuit 60 can be a circuit that receives an external signal as well as signals from the first and second selection circuits (41 and 42). From such signals, a determination circuit 60 may determine the selection status of first and second memory sections (10 and 20). In one particular arrangement, a determination circuit 60 may be connected to common I/O buffer circuit 50, a first address buffer 12, and a second address buffer 22.

Figure 2:
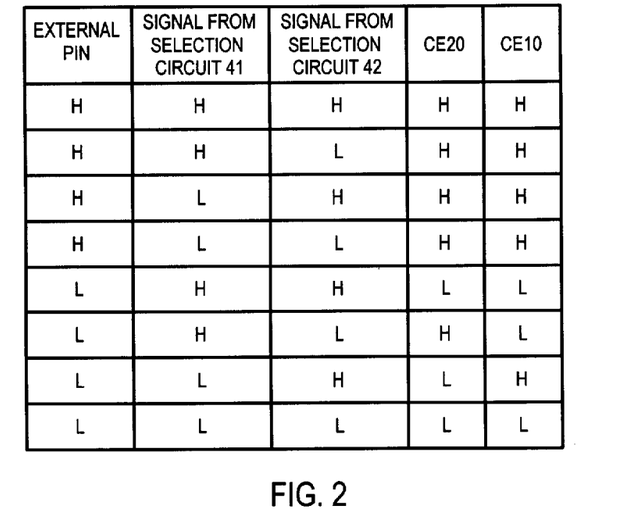
FIG. 2 is truth table illustrating the operation of a determination circuit according to one embodiment FIG. 3 schematic diagram of a determination circuit according to one embodiment.

FIG. 2 shows a truth table showing the operation of one possible determination circuit 60. According the logic value applied to an external pin, the output of the first selection circuit 41, and the output of the second selection circuit 42, various combinations of first and second chip selection signals (CE10 and CE20) may be generated. In the particular operations described in FIG. 2, when a high control signal is applied to the external pin, the first and second chip selection signals (CE10 and CE20) are both high, regardless of the values output from the first and second selection circuits (41 and 42). With both the chip selection signals (CE10 and CE20) high, the first and second memory sections (10 and 20) can both be activated. Such a configuration may be used in a burn-in test.

On the other hand, when a low control signal is applied to the external pin, only one or none of the memory sections (10 and 20) can be activated. Such a configuration may be used in a normal mode of operation.

In the particular example of FIG. 2, if a low control signal is applied, the output of the first selection circuit 41 is low, and the output of the second selection circuit 42 is high, the first chip selection signal CE10 is high, activating the first memory section 10, and the second chip selection signal CE20 is low, deactivating the second memory section 20. However, if a low control signal is applied, the output of first selection circuit 41 is high, and the output of the second selection circuit 42 is low, the first chip selection signal CE10 is low, deactivating the first memory section 10, and the second chip selection signal CE20 is high, activating the second memory section 20. In this way, one of the memory sections (10 and 20) may be activated.

Also shown in FIG. 2 is a mode in which both memory sections (10 and 20) may be deactivated. In particular, if a low control signal is applied, and the outputs of the first and second selection circuits (41 and 42) have the same value (i.e., both are high or both are low), the first and second chip selection signals (CE10 and CE20) are low, deactivating both the first and second memory sections (10 and 20). In this way, the activation of more than one memory section (10 and 20) can be prevented.

Figure 3:
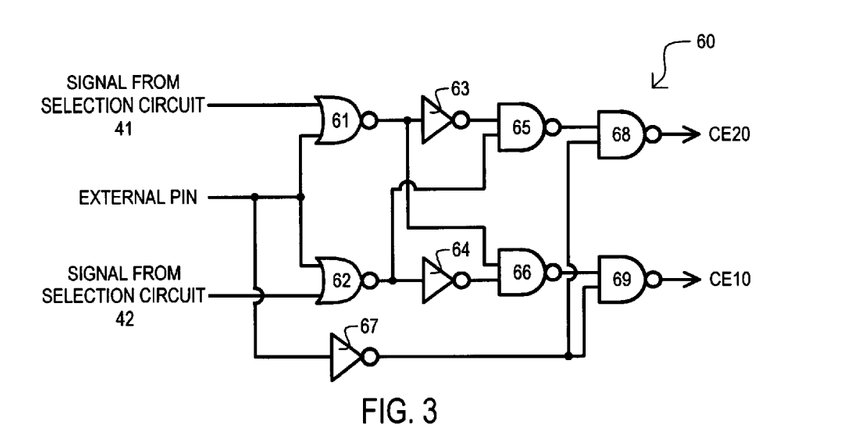

Referring now to FIG. 3 one determination circuit according to one embodiment is set forth in a schematic diagram. The determination circuit 60 of FIG. 3 can provide a response such as that illustrated in the truth table of FIG. 2. The particular determination circuit of FIG. 3 is shown to include a first NOR gate 61, a second NOR gate 62, a first inverter 63, a second inverter 64, a first NAND gate 65, a second NAND gate 66, a third inverter 67, a third NAND gate 68, and a fourth NAND gate 69.

One skilled in the art would recognize that first and second NOR gates (61 and 62) can be considered first and second input gates, third and fourth NAND gates (68 and 69) can be considered first and second output gates, and first and second NAND gates (65 and 66) can be considered first and second intermediate gates.

An output from first selection circuit 41 can be supplied as one input to first NOR gate 61 while the other input receives a control signal applied to an external pin. An output from second selection circuit 42 can be supplied as one input to second NOR gate 62 while the other input receives the control signal. The first NOR gate 61 can perform a logical NOR between the output from the first selection circuit 41 and the control signal. Similarly, the second NOR gate 62 can perform a logical NOR between the output from the second selection circuit 42 and the control signal. The output of first NOR gate 61 can be provided as an input to first inverter 63 and an input to second NAND gate 66. The output of second NOR gate 62 can be provided as an input to second inverter 64 and an input to first NAND gate 65.

First inverter 63 inverts the output from first NOR gate 61 and provides the result as another input to first NAND gate 65. Second inverter 64 inverts the output from second NOR gate 62 and provides the result as another input to second NAND gate 66. First NAND gate 65 can perform a logical NAND operation on the output of first inverter 63 and the output of second NOR gate 62. The output of first NAND gate 65 may then be provided as an input to third NAND gate 68. Second NAND gate 66 can perform a logical NAND operation on the output of second inverter 64 and the output of first NOR gate 61. The output of second NAND gate 66 may then be provided as an input to fourth NAND gate 69.

A control signal applied to an external pin can be inverted by third inverter 67. The output of third inverter 67 may then be supplied as an input to both the third NAND gate 68 and the fourth NAND gate 69. The third NAND gate 68 can perform a logical NAND between the output of first NAND gate 65 and the output of third inverter 67 to generate the second chip selection signal CE20. The fourth NAND gate 69 can perform a logical NAND between the output of second NAND gate 66 and the output of third inverter 67 to generate the second chip selection signal CE10.

If reference is made to FIG. 3 in conjunction with FIG. 1, a first chip selection signal CE10 may be applied to a first address buffer 12 of first memory section 10 as well as a common I/O buffer circuit 50. A second chip selection signal CE20 may be applied to a second address buffer 22 of second memory section 20 as well as the common I/O buffer circuit 50.

Having described one arrangement for a particular embodiment, the operation of the particular embodiment will now be described with reference to FIGS. 1–3. In the following description, it will be assumed that the first memory section 10 and second memory section 20 are both active when the first chip selection signal CE10 and second chip selection signal CE20, respectively, are high.

A normal operation will first be described. In a normal operation, a control signal supplied to a determination circuit from an external pin can be at a logic low level. As will be recalled from FIG. 2, according to such an input, a memory section (10 and 20) may be selected when a logic low input is supplied to the first or second selection circuit (41 and 42).

In one normal mode configuration, a logic low signal can be applied to a first memory section selection pin0 and a logic high signal can be applied to second memory section selection pin1. A logic low can thus be supplied from first selection circuit 41 as one input to determination circuit 60, and a logic high can thus be supplied from second selection circuit 42 as another input to determination circuit 60.

If reference is made back to FIG. 3, with a low signal from first selection circuit 41 and a low signal at the external pin, the output of first NOR gate 61 can be high. However, with a high signal from second selection circuit 42 and a low signal at the external pin, the output of second NOR gate 62 can be low. First inverter 63 can receive the high output from first NOR gate 61 and provide a low input to first NAND gate 65. A low input to first NAND gate 65 forces the output of first NAND gate 65 high. Second inverter 64 can receive the low output from second NOR gate 62 and provide a high input to second NAND gate 66. Second NAND gate 66 can receive another high input from first NOR gate 61. The output of second NAND gate 66 is thus driven low. Third inverter 67 can receive the low signal at external pin and provide a high input to both third and fourth NAND gates (68 and 69). Third NAND gate 68 receives another high input from first NAND gate 65, and thus provides a low second chip selection signal CE20 as an output. Fourth NAND gate 69 receives a low input from second NAND gate 66, and thus provides a high first chip selection signal CE10 as an output. In this way, a low value at external pin, a low value from first chip signal selection circuit 41, and a high value from second chip signal selection circuit 42 can result in a high first chip selection signal CE10 and a low second chip selection signal CE20.

If reference is made back to FIG. 1, a high first chip selection signal CE10 can activate a first address buffer 12 and common I/O buffer circuit 50. This can select first memory section 10.

In another normal mode configuration, a logic high signal can be applied to memory section selection pin0 and a logic low signal can be applied to memory section selection pin1. A logic high can thus be supplied from first selection circuit 41 as one input to determination circuit 60, and a logic low can thus be supplied from second selection circuit 42 as another input to determination circuit 60.

If reference is made to FIG. 3 again, with a high signal from first selection circuit 41 and a low signal at the external pin, the output of first NOR gate 61 can be low. However, with a low signal from second selection circuit 42 and a low signal at the external pin, the output of second NOR gate 62 can be high. First inverter 63 can receive the low output from first NOR gate 61 and provide a high input to first NAND gate 65. First NAND gate 65 can receive another high input from second NOR gate 62. The output of first NAND gate 65 is thus driven low. Second inverter 64 can receive the high output from second NOR gate 62 and provide a low input to second NAND gate 66. A low input to second NAND gate 66 forces the output of second NAND gate 66 high. Third inverter 67 can receive the low signal at external pin and provide a high input to both third and fourth NAND gates (68 and 69). Fourth NAND gate 69 receives another high input from second NAND gate 66, and thus provides a low first selection signal CE10 as an output. Third NAND gate 68 receives a low input from first NAND gate 65, and thus provides a high second selection signal CE20 as an output. In this way, a low control signal value at the external pin, a high value from first signal selection circuit 41, and a low value from second signal selection circuit 42 can result in a low first chip selection signal CE10 and a high second chip selection signal CE20.

If reference is made back to FIG. 1, a high second chip selection signal CE20 can activate a second address buffer 22 and common I/O buffer circuit 50. This can select second memory section 20.

In yet another normal mode configuration, a logic high signal can be applied to both a first memory section selection pin0 and a second memory section selection pin1. Logic high values can thus be supplied from first selection circuit 41 and second selection circuit 42 as inputs to determination circuit 60.

If reference is made to FIG. 3 again, with a high signals from first and second selection circuits (41 and 42) and a low signal at the external pin, the outputs of first and second NOR gates (61 and 62) can be low. The low output of first NOR gate 61 forces the output of second NAND gate 66 high. Similarly, the low output of second NOR gate 62 forces the output of first NAND gate 65 high. Third inverter 67 can receive the low control signal at external pin and provide a high input to both third and fourth NAND gates (68 and 69). Third and fourth NAND gates (68 and 69) can also receive high inputs from first and second NAND gates (65 and 66), respectively. Thus, the third NAND gate 68 and fourth NAND gate 69 provide a low second chip selection signal CE20 and low first chip selection signal CE10 as outputs.

In this way, a low value at the external pin and high values from both the first signal selection circuit 41 and second signal selection circuit 42 can result in a low first and second chip selection signals (CE10 and CE20).

If reference is made back to FIG. 1, a low first selection signal CE10 can deactivate a first address buffer 12 and common I/O buffer circuit 50. This can deselect first memory section 10. Similarly, a low second selection signal CE20 can deactivate a second address buffer 22 and common I/O buffer circuit 50. This can deselect the second memory section 20.

In yet another normal mode configuration, a logic low signal can be applied to both a first memory section selection pin0 and a second memory section selection pin1. Logic low values can thus be supplied from first selection circuit 41 and second selection circuit 42 as inputs to determination circuit 60.

If reference is made to FIG. 3 again, with low signals from first and second selection circuits (41 and 42) and a low signal at the external pin, the outputs of first and second NOR gates (61 and 62) can be high. The high output of first NOR gate 61 is inverted by first inverter 63. The resulting low output of first inverter 63 forces the output of first NAND gate 65 high. Similarly, the high output of second NOR gate 62 is inverted by second inverter 64. The resulting low output of second inverter 64 forces the output of second NAND gate 66 high. Third inverter 67 can receive the low control signal at external pin and provide a high input to both third and fourth NAND gates (68 and 69). Third and fourth NAND gates (68 and 69) can also receive high inputs from first and second NAND gates (65 and 66), respectively. Thus, the third NAND gate 68 and fourth NAND gate 69 provide a low second chip selection signal CE20 and low first chip selection signal CE10 as outputs.

In this way, low values at the external pin and from both the first signal selection circuit 41 and second signal selection circuit 42 can result in a low first and second chip selection signals (CE10 and CE20).

As noted above, a low first selection signal CE10 can deactivate a first address buffer 12 and common I/O buffer circuit 50. This can deselect first memory section 10. Similarly, a low second selection signal CE20 can deactivate a second address buffer 22 and common I/O buffer circuit 50. This can deselect second memory section 20.

It is noted that the above-described mode of operation, where low logic values can be applied to both a first memory selection pin (pin0) and a second memory selection pin (pin1) could have adverse consequences in conventional arrangements, particularly if multiple memory sections share common circuit components. In particular, if a first memory section and second memory section share a common I/O buffer circuit, activating a first and second memory section simultaneously can result in data for both memory sections being read and/or written through the common I/O buffer circuit. The disclosed embodiments can overcome such a drawback by deselecting both memory sections (10 and 20) when both memory section selection pins (pin0 and pin1) both receive an active (low in this example) input signal.

An alternate mode of operation will now be described. Such a mode of operation can be used in a burn-in test, for example.

In an alternate mode of operation, a control signal supplied to a determination circuit from an external pin can be at a logic high level. As will be recalled from FIG. 2, according to such an input, regardless of the values applied to the first or second section selection pins (pin0 or pin1), the first and second memory sections (10 and 20) are both selected.

If reference is made back to FIG. 3, a high control signal applied to external pin can be inverted by third inverter 67. A low output from third inverter 67 can be provided as inputs to third and fourth NAND gates (68 and 69), forcing their respective outputs high. In this way the first section selection signal CE10 and second section selection signal CE20 can both be forced high.

If reference is made back to FIG. 1, a high first selection signal CE10 can activate a first address buffer 12 and common I/O buffer circuit 50. Similarly, a high second selection signal CE20 can activate a second address buffer 22 and common I/O buffer circuit 50. In this way, both memory sections (10 and 20) can be selected in an alternate mode, such as for a burn-in test.

FIG. 3 thus illustrates one example of determination circuit 60 that may operate according to the truth table of FIG. 2.

Figure 6B:
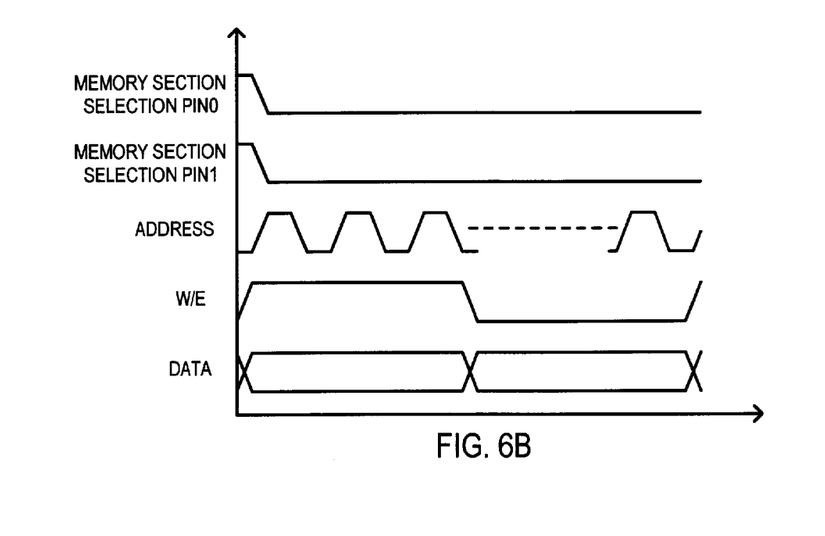
FIG. 6B is a timing diagram showing the access to memory cells in a burn-in test in a semiconductor storage device according to the present invention.

Referring now to FIG. 6B, a timing diagram is set forth contrasting the operation of one embodiment with the conventional case of FIG. 6A. In FIG. 6B, a low value is applied to both memory section selection pin0 and memory section selection pin1 at the same time. As discussed above, such a configuration is avoided in the conventional case of FIG. 5 because it can generate erroneous results in a normal mode of operation.

The present invention, particular embodiments of which have been disclosed, includes a control section that may activate multiple memory sections only in a particular alternate mode, such as a burn-in test. In addition, or alternatively, the present invention can prevent various combinations of input signals from activating multiple memory sections in normal modes of operation. Rapid burn-test times can result, while at the same time overcoming the drawbacks of conventional approaches.

Figure 4:
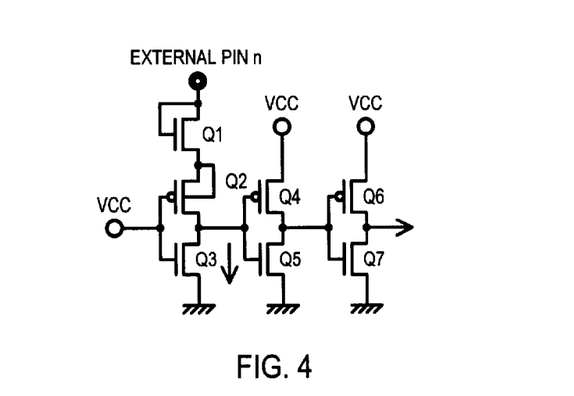
FIG. 4 is a schematic diagram of a high voltage detection circuit that may be used in another embodiment.

It is understood that the various embodiments should not be construed as limiting the invention thereto. While the embodiments illustrate particular logic values for entering a burn-in test mode, various alternate approaches may also be employed. As but one example, a high voltage detection circuit may be included, such as that shown in FIG. 4. When a high voltage is applied to an external pin n, a high output signal can result. Otherwise, a low output signal will be provided. Alternate arrangements may include applying particular waveforms to enter a burn-in test mode.

Further, the particular number and type of memory sections disclosed should also not be construed as limiting. A semiconductor storage device according to the present invention may, of course, include more than two memory sections. Along these same lines, the particular type of memory sections shown (i.e., a RAM and ROM) should not be construed as limiting. Memory sections could include one or more different types of RAMs, including but not limited to dynamic RAMs (DRAMs), static RAMs (SRAMs) and ferroelectric RAMs (FRAMs). In addition or alternatively, memory sections could include one or more different types of ROMs, including but not limited to mask ROMs, electrically programmable ROMs (EPROMs), and electrically erasable and programmable ROMs (EEPROMs, including "flash" EEPROMs). Of course, these represent but a few of the many types of memory device combinations that may be included.

Still further, the particular determination circuit of FIG. 3 and the truth table response of FIG. 2 should not be construed as limiting. Numerous other logic circuit configurations may arrive at the functionality of FIG. 2. Further, alternate determination circuits can be used in embodiments that receive different input signal combinations than the particular examples shown in the described embodiments.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor storage device, comprising:
   a plurality of memory sections, each memory section including memory cells of a different type; and
   controlling means for simultaneously operating the memory sections in a burn-in mode and preventing the simultaneous operation of the memory sections in a normal mode.

2. The semiconductor storage device of claim 1, wherein:
   the controlling means includes a determination circuit that enters the burn-in mode and the normal mode according to a control signal.

3. The semiconductor storage device of claim 2, further including:

each memory section is operated by a corresponding chip select signal; and the controlling means includes a determination circuit that receives the control signal and at least two memory section select signals and provides at least one chip select signal corresponding to each memory section select signal, wherein in the normal mode, the determination circuit prevents the activation of more than one of the chip select signals in response to all combinations of memory section select signals; and in the burn-in test mode, the determination circuit activates a plurality of the chip select signals in response to various combinations of memory section select signals.

4. The semiconductor storage device of claim 3, wherein:

the determination circuit includes a first output gate that provides a first chip select signal and a second output gate that provides a second chip select signal, the first and second output gates having an input coupled to the control signal.

5. The semiconductor storage device of claim 3, wherein:

the determination circuit includes a first input gate that logically combines the control signal with a first memory section selection signal to generate a first input stage signal and a second input gate that logically combines the control signal with a second memory section selection signal to generate a second input stage signal.

6. The semiconductor storage device of claim 5, wherein:

the determination circuit includes a first intermediate gate that logically combines the second input stage signal with an inverted first input stage signal and a second intermediate gate that logically combines the first input stage signal with an inverted second input stage signal.

7. The semiconductor storage device of claim 2, further including:

a high voltage detection circuit that activates the control signal when the potential at an external pin exceeds a predetermined magnitude.

8. The semiconductor storage device of claim 2, wherein:

the control signal is activated by the application of a predetermined waveform to one or more external pins.

9. A semiconductor storage device, comprising:

a determination circuit that receives at least one control signal and a plurality of section select signals, the determination circuit activating no more than one memory section according to particular section select signal combinations when the at least one control signal has a first value, the determination circuit activating at least two memory sections when the at least one control signal has a second value.

10. The semiconductor storage device of claim 9, further including;

a first selection circuit that generates a first section select signal in response to the potential at a first selection pin; and a second selection circuit that generates a second section select signal in response to the potential at a second selection pin.

11. The semiconductor storage device of claim 9, wherein:

the determination circuit activates a first memory section when the at least one control signal has the first value and a first section select signal has one logic value, activates a second memory section when the at least one control signal has the first value and a second section select signal has the one logic value, and activates the first and second memory sections when the at least one control signal has the second value.

12. The semiconductor storage device of claim 11, wherein:

the determination circuit provides a first chip select signal that activates the first memory section and a second chip select signal that activates the second memory section.

13. The semiconductor storage device of claim 12, wherein:

the first memory section includes a first address buffer coupled to an address bus that is enabled by the first chip select signal; and the second memory section includes a second address buffer coupled to the address bus that is enabled by the second chip select signal.

14. The semiconductor storage device of claim 12, further including:

a common input/output (I/O) buffer circuit coupled between the first and second memory sections and at least one external I/O pin, the common I/O buffer circuit receiving the first and second chip select signals.

15. A method of operating a semiconductor storage device having a plurality of memory sections of different types, comprising:

operating a plurality of memory sections in a burn-in test mode; and preventing the operation of more than one memory section in a normal mode.

16. The method of claim 15, wherein:

operating a plurality of memory sections includes activating a plurality of chip enable signals in response to a control signal at a first logic level.

17. The method of claim 16, wherein:

activating a plurality of chip enable signals includes providing an output gate to generate each chip enable signal, the output of each output gate being forced to a predetermined value when the control signal is at the first logic level.

18. The method of claim 15, wherein:

preventing the operation of more than one memory section includes deactivating a plurality of chip enable signals in response to a control signal at a second logic level and more than one section select signal at an active level.

19. The method of claim 18, wherein:

deactivating a plurality of chip enable signals includes logically combining more than one section select signal to determine when more than one section select signal is active.

20. The method of claim 15, wherein:

operating a plurality of memory sections includes enabling a plurality of address buffers; and preventing the operation of more than one memory section includes enabling one of the address buffers when a corresponding one memory selection pin receives a predetermined logic level and disabling all address buffers when more than one memory selection pin receives the predetermined logic level.

* * * * *